United States Patent
Cheng et al.

(10) Patent No.: US 12,211,923 B2
(45) Date of Patent: Jan. 28, 2025

(54) SEMICONDUCTOR STRUCTURE AND FORMING METHOD THEREOF

(71) Applicant: ENKRIS SEMICONDUCTOR, INC., Suzhou (CN)

(72) Inventors: Kai Cheng, Suzhou (CN); Kai Liu, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 836 days.

(21) Appl. No.: 17/190,765

(22) Filed: Mar. 3, 2021

(65) Prior Publication Data

US 2021/0193820 A1 Jun. 24, 2021

Related U.S. Application Data

(63) Continuation of application No. PCT/CN2018/104556, filed on Sep. 7, 2018.

(51) Int. Cl.
*H01L 29/66* (2006.01)
*H01L 29/20* (2006.01)
*H01L 29/207* (2006.01)
*H01L 29/778* (2006.01)

(52) U.S. Cl.
CPC .... *H01L 29/66462* (2013.01); *H01L 29/2003* (2013.01); *H01L 29/207* (2013.01); *H01L 29/778* (2013.01)

(58) Field of Classification Search
CPC ........... H01L 29/66462; H01L 29/2003; H01L 29/207; H01L 29/778
See application file for complete search history.

(56) References Cited

U.S. PATENT DOCUMENTS

| | | |
|---|---|---|
| 2006/0214193 A1 | 9/2006 | Hayamura et al. |
| 2018/0197737 A1 | 7/2018 | Kinoshita |
| 2019/0006503 A1* | 1/2019 | Ishiguro ............ H01L 29/66462 |
| 2019/0020318 A1* | 1/2019 | Ishiguro ............ H01L 21/0254 |

FOREIGN PATENT DOCUMENTS

| | | | |
|---|---|---|---|
| CN | 1618116 A | 5/2005 | |
| CN | 1770484 * | 5/2006 | ....... H01L 21/02381 |
| CN | 1770484 A | 5/2006 | |
| CN | 101410985 A | 4/2009 | |
| CN | 102386216 A | 3/2012 | |
| CN | 103715242 A | 4/2014 | |
| CN | 106024881 A | 10/2016 | |
| CN | 106165072 A | 11/2016 | |
| CN | 107134484 A | 9/2017 | |

OTHER PUBLICATIONS

International Search Report in corresponding PCT Application No. PCT/CN2018/104556, dated Jan. 16, 2019.
Written Opinion in corresponding PCT Application No. PCT/CN2018/104556, dated Jan. 16, 2019.
First Office Action issued in counterpart Chinese Patent Application No. 201880097214.1, dated Feb. 9, 2024.

* cited by examiner

*Primary Examiner* — Samuel A Gebremariam
(74) *Attorney, Agent, or Firm* — Westbridge IP LLC

(57) ABSTRACT

The present disclosure provides a semiconductor structure and a forming method thereof. The semiconductor structure includes: a substrate and an epitaxial layer disposed on the substrate. At least a part of the epitaxial layer is doped with metal atoms, and the doping concentration of the metal atoms at the bottom surface of the epitaxial layer near the substrate is larger than $1\times10^{17}$ atoms/cm$^3$.

20 Claims, 8 Drawing Sheets

RMS =0.59nm

RMS=0.19nm

SEMICONDUCTOR STRUCTURE AND FORMING METHOD THEREOF

CROSS-REFERENCE TO RELATED APPLICATIONS

This application is a continuation of International Application No. PCT/CN2018/104556 filed on Sep. 7, 2018, the disclosure of which is hereby incorporated by reference in its entirety.

TECHNICAL FIELD

The present disclosure relates to semiconductor technology, and in particular, to a semiconductor structure with a metal doped layer and a method for forming the same.

BACKGROUND

A group III-V based semiconductor material (e.g., GaN, AlGaN or the like) has many advantages in terms of its electrical, physical and chemical properties, such as wide band gaps, high electron mobility, high breakdown voltage, and excellent chemical stability. Therefore, this material is particularly well suited to high-power, high-frequency, and high-temperature applications. Semiconductor devices for these types of applications exhibit high electron mobility and can withstand high voltage, while operating at a high frequency. For example, these devices may include high electron mobility transistors (HEMTs), heterojunction field-effect transistors (HFETs), or modulation doped field effect transistors (MODFETs).

SUMMARY

In some embodiments of the disclosure, a method of forming a semiconductor structure is provided. The method of forming a semiconductor structure includes: providing a substrate; forming a discontinuous metal atomic layer on the substrate; and forming an epitaxial layer on the discontinuous metal atomic layer, wherein metal atoms of the discontinuous metal atomic layer are driven into the epitaxial layer during the growth of the epitaxial layer, so that at least a part of the epitaxial layer is doped with metal atoms. Owing to the discontinuous metal atomic layer, a phenomenon of current leakage corresponding to diffusion of atoms from the substrate is eliminated, and the epitaxial layer has smoother surface morphology, better crystalline quality and higher resistivity because of doping with metal atoms.

In some embodiments of the disclosure, the method further includes forming a nucleation layer between the substrate and the discontinuous metal atomic layer.

In some embodiments of the disclosure, the nucleation layer includes GaN, AlN, AlGaN, AlInGaN, or a combination thereof.

In some embodiments of the disclosure, the epitaxial layer includes GaN, AlN, AlGaN, AlInGaN, or a combination thereof.

In some embodiments of the disclosure, the metal of discontinuous metal atomic layer comprises Fe, Mn, Sb, Bi, Cd, Zn, Mg, Na, or a combination thereof.

In some embodiments of the disclosure, the method further includes forming a heterojunction on the epitaxial layer; and forming a gate structure, a source contact, and a drain contact on the heterojunction.

In some embodiments of the disclosure, a semiconductor structure is provided, the semiconductor structure includes: a substrate, and an epitaxial layer disposed on the substrate, wherein the epitaxial layer comprises a metal-doped layer doped with metal atoms disposed on the substrate, the doping concentration of the metal atoms is decreased form a bottom surface to the top surface of the metal-doped layer and the doping concentration of the metal atoms at the bottom surface of the metal-doped layer is larger than $1 \times 10^{17}$ atoms/cm$^3$.

In some embodiments of the disclosure, the semiconductor structure further includes a nucleation layer between the substrate and the metal-doped layer.

In some embodiments of the disclosure, the nucleation layer includes GaN, AlN, AlGaN, AlInGaN, or a combination thereof.

In some embodiments of the disclosure, the epitaxial layer includes AlN, AlGaN, AlInN, AlInGaN, or a combination thereof.

In some embodiments of the disclosure, the metal atom includes Fe, Mn, Sb, Bi, Cd, Zn, Mg, Na, or a combination thereof.

In some embodiments of the disclosure, the semiconductor structure further includes a heterojunction on the epitaxial layer; and a gate structure, a source contact, and a drain contact on the heterojunction.

BRIEF DESCRIPTION OF DRAWINGS

The present disclosure can be further understood by reading the subsequent detailed description and examples with references made to the accompanying drawings, wherein.

DETAILED DESCRIPTION OF THE EMBODIMENTS

Figure 1A:
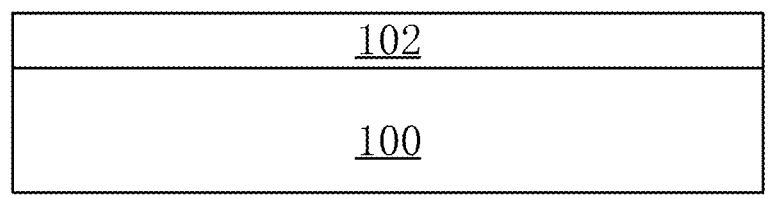
FIG. 1A to FIG. 1E illustrate some semiconductor structures corresponding to various stages of a method 200 in accordance with some embodiments.

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

Referring to FIG. 1A to FIG. 1E and FIG. 2, FIG. 2 shows a method 200 of forming a semiconductor structure according to embodiments of this disclosure, FIG. 1A to FIG. 1E illustrate some semiconductor structures corresponding to various stages of the method 200 in accordance with some embodiments.

Figure 2:
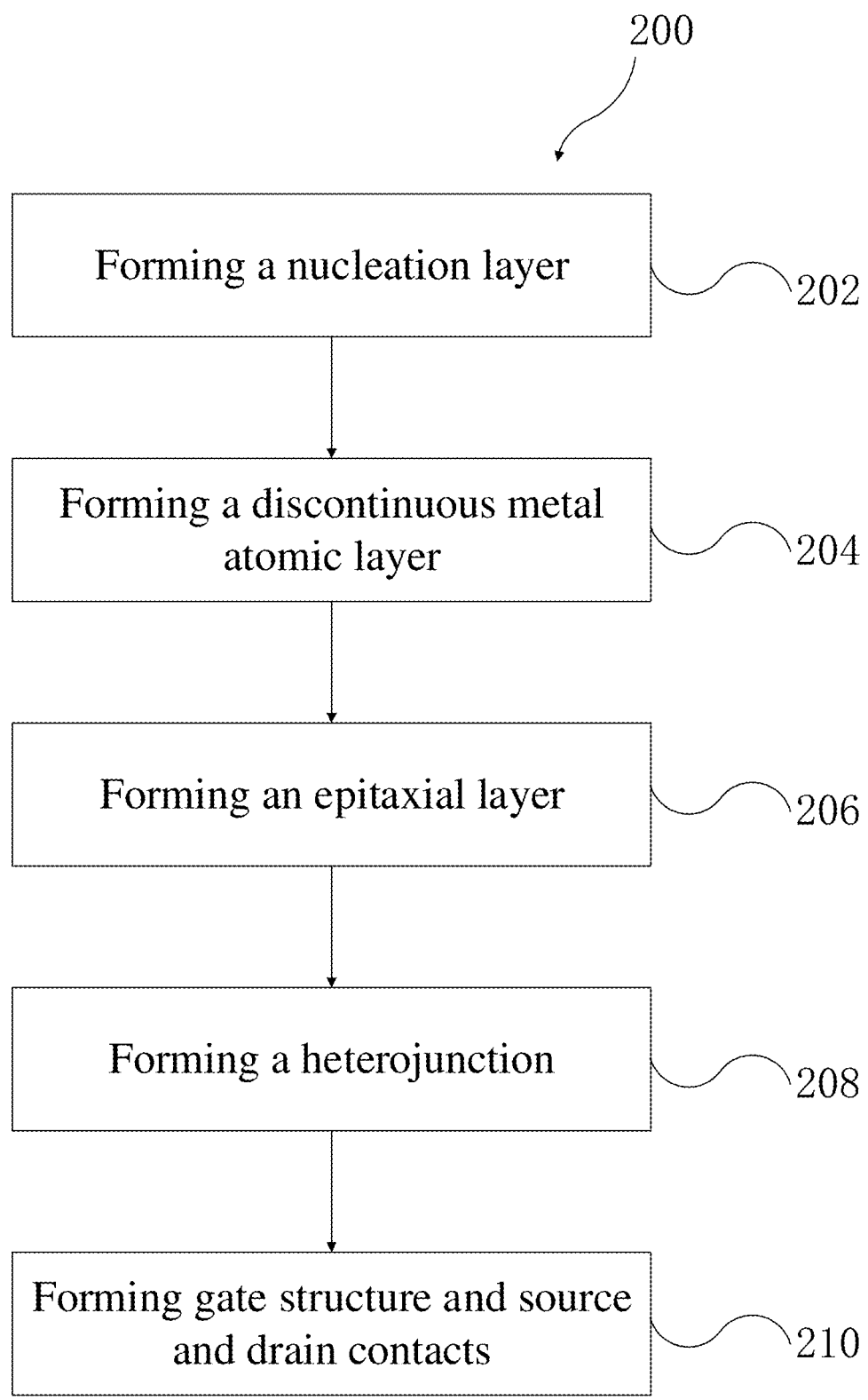
FIG. 2 shows the method 200 of forming a semiconductor structure according to some embodiments of this disclosure.

Additional operation steps can be provided before, during, and/or after the steps described in FIG. 2. Moreover, in different embodiments, some of the steps that are described in FIG. 2 can be replaced or eliminated. In some embodiments, the semiconductor device 200 is implemented as a transistor (e.g., HEMT, HFET, or MOSFET).

As shown in FIG. 2 and FIG. 1A, the method 200 includes a step 202: forming a nucleation layer 102 on a substrate 100. In some embodiments, the substrate 100 is formed of a material that is suitable for growing a semiconductor structure including Group III nitride material (e.g., GaN, AlGaN, AlInGaN, AlN). For example, the substrate 100 may be formed of Si, sapphire (Al2O3), SiC, or another suitable material.

In some embodiments, the nucleation layer 102 is optional and may include AlN, GaN, AlGaN, AlInGaN, or a combination thereof and have a thickness in a range of about 0.1 nm to 500 nm. In some embodiments, the nucleation layer 102 may be grown onto the sapphire, silicon carbide, or silicon substrate by metal-organic chemical vapor deposition (MOCVD), hydride vapor phase epitaxy (HVPE), liquid phase epitaxy (LPE), molecular beam epitaxy (MBE), metal organic VPE (MOVPE), plasma-enhanced CVD (PECVD), or the like.

Figure 1B:
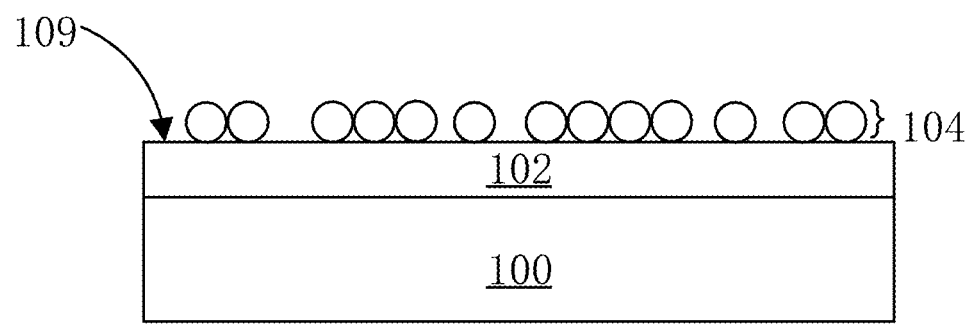

Referring to FIG. 2 and FIG. 1B, the method 200 includes a step 204: forming a discontinuous metal atomic layer 104 on an upper surface 109 of the nucleation layer 102. In some embodiments, the discontinuous metal atomic layer 104 may be employed to provide doped impurities (i.e., metal atoms) for achieving a semiconductor material layer with high resistivity. In some embodiments, the discontinuous metal atomic layer 104 may be formed of a material containing at least one metal that is selected from the group of Fe, Mn, Sb, Bi, Cd, Zn, Mg, and Na. In some embodiments, the discontinuous metal atomic layer 104 is formed by an atomic layer deposition (ALD) process, MOCVD process or another suitable deposition process. In these cases, the discontinuous metal atomic layer 104 may be a single atomic layer and expose parts of the nucleation layer 102.

Figure 1C:
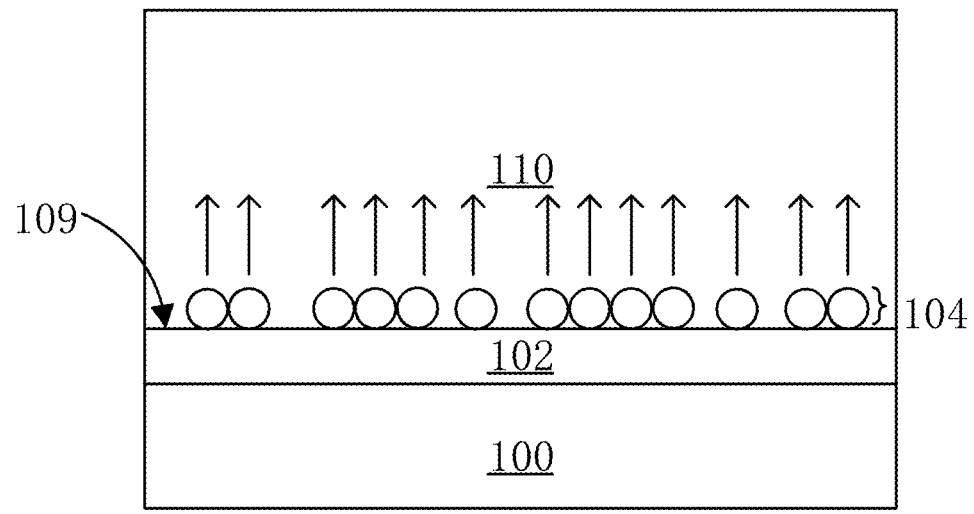

Referring to FIG. 1C and FIG. 2, the method 200 includes a step 206: forming an epitaxial layer (e.g., a semiconductor material) 110 on the discontinuous metal atomic layer 104 and parts of the nucleation layer 102 uncovered by the discontinuous metal atomic layer 104. In some embodiments, the epitaxial layer 110 includes Group III nitride material (e.g., GaN, AlGaN, AlInGaN, AlN). In some embodiments, the epitaxial layer 110 may be a buffer layer. In some embodiments, the epitaxial layer 110 is formed by MOCVD, HYPE, LPE, MBE, MOVPE, PECVD, or another suitable deposition.

Figure 1D:
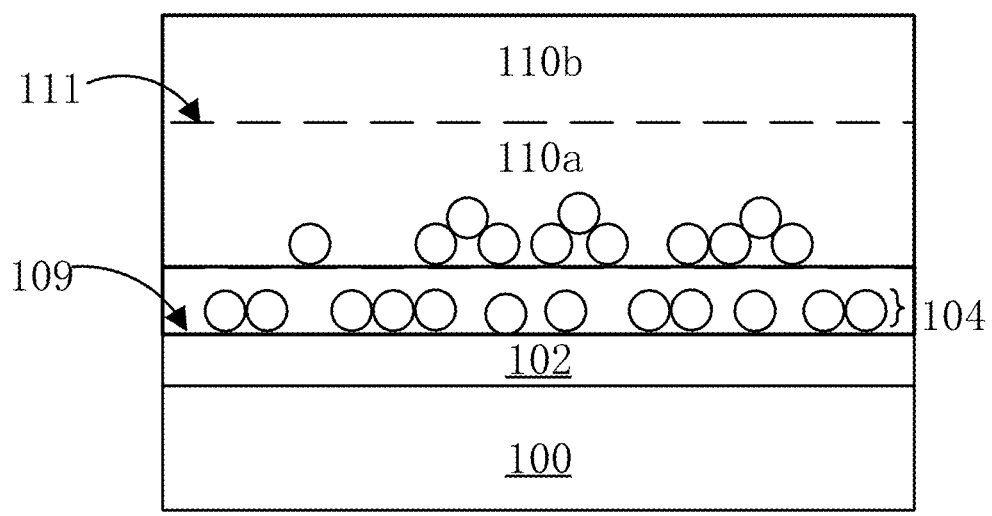

In some embodiments, metal atoms (e.g., Fe, Mn, Sb, Bi, Cd, Zn, Mg, Na, or a combination thereof) of the discontinuous metal atomic layer 104 may be driven into (indicated by the arrows shown in FIG. 1C) the epitaxial layer 110 during the growth of the epitaxial layer 110 due to an auto-doping effect, so that at least a part of the epitaxial layer 110 is doped with metal atoms. As shown in FIG. 1D, since some metal atoms of the discontinuous metal atomic layer 104 are driven into a part of the epitaxial layer 110 (as shown in FIG. 1C) due to the unintentional auto-doping effect, a metal-doped layer 110a is doped with the metal atoms therein and an overlying epitaxial layer 110b is not doped with the metal atoms. In some embodiments, the epitaxial layer 110 may only include the metal-doped layer 110a, that is, the overlying epitaxial layer 110b is eliminated. Owing to the metal dopant, the metal-doped layer 110a has smoother surface morphology, better crystalline quality and higher resistivity.

Figure 5A:
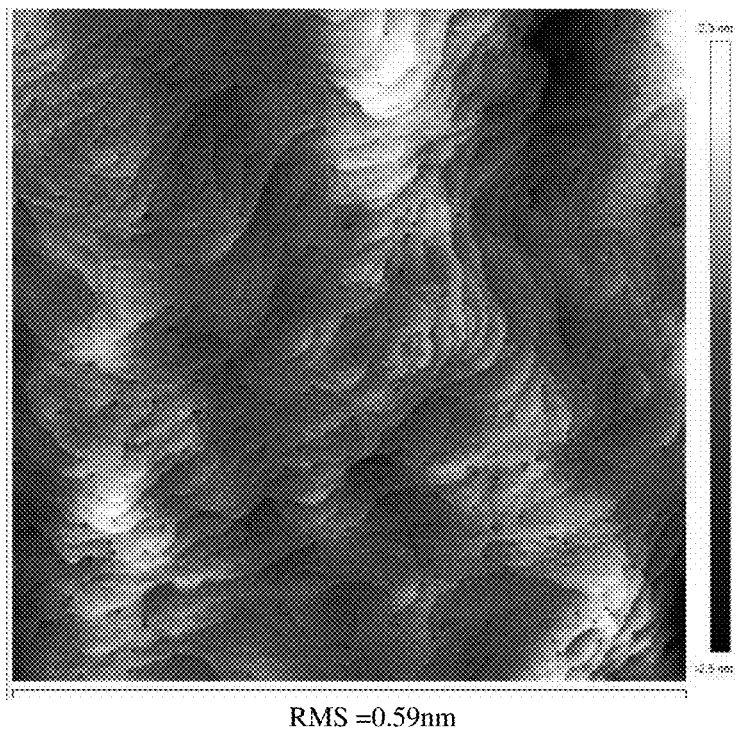
FIG. 5A is a 5×5 µm$^2$ AFM scan of an epitaxial layer without metal doping.
Figure 5B:
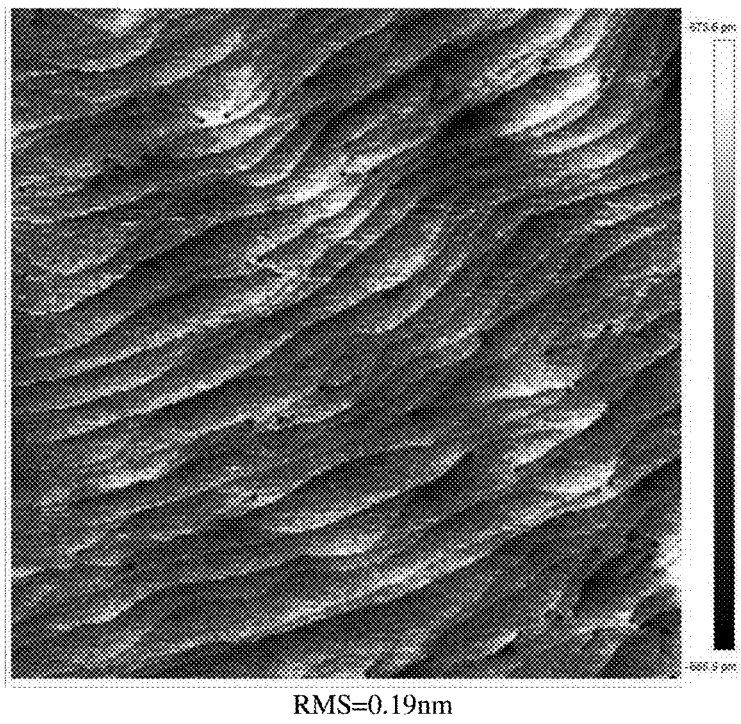
FIG. 5B is a 5×5 µm$^2$ AFM scan of an epitaxial layer with metal doping.

Referring to FIG. 5A and FIG. 5B, FIG. 5A is a 5×5 μm² atomic force microscope (AFM) scan of an epitaxial layer without metal doping in one embodiment, and the epitaxial layer in this embodiment is GaN. FIG. 5B is a 5×5 μm² AFM scan of an epitaxial layer with metal doping in one embodiment, and the epitaxial layer in this embodiment is GaN. In FIG. 5A, the root mean square (Rms) roughness of the interface of the epitaxial layer without metal doping is approximately 0.59 nm. In FIG. 5B, the root mean square (Rms) roughness of the interface of the epitaxial layer with metal doping is approximately 0.19 nm. Obviously, the epitaxial layer with metal doping has smoother surface morphology.

Figure 6A:
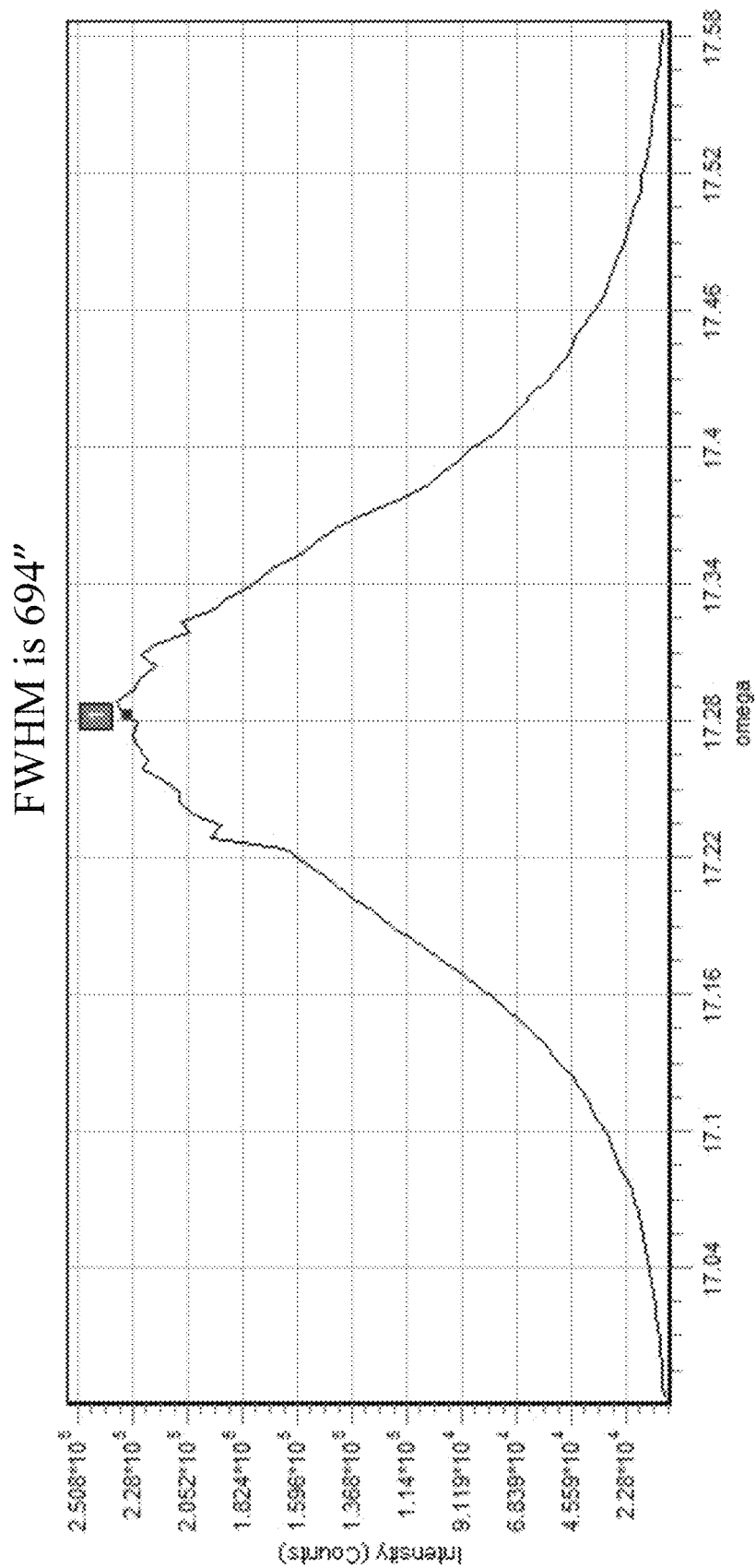
FIG. 6A is a graph showing X-ray diffraction (XRD) omega rocking curve of the (002) face of a GaN epitaxial layer without metal doping in one embodiment.
Figure 6B:
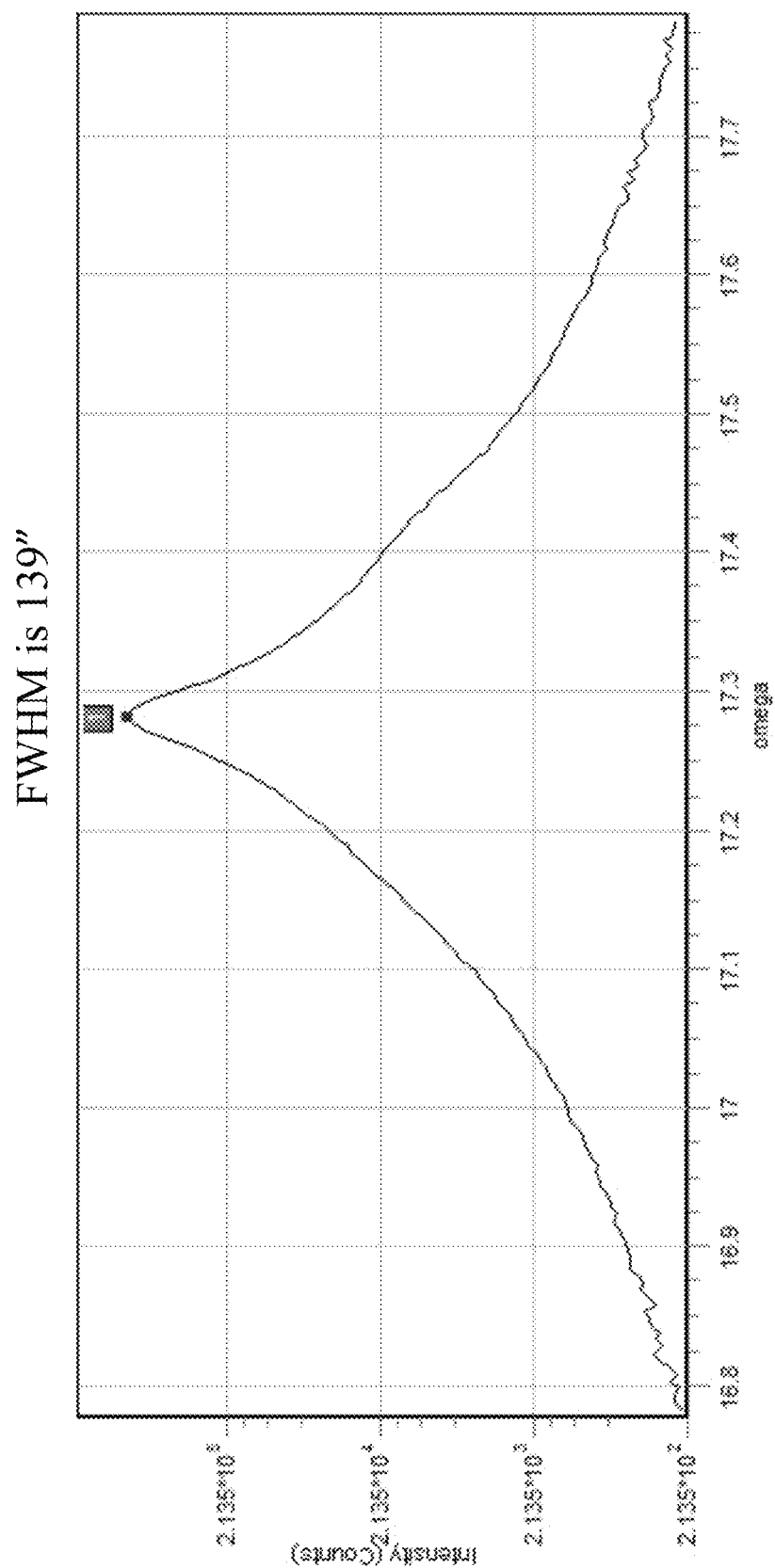
FIG. 6B is a graph showing XRD omega rocking curve of the (002) face of a GaN epitaxial layer with metal doping in one embodiment.

Referring to FIG. 6A and FIG. 6B, FIG. 6A is a graph showing X-ray diffraction (XRD) omega rocking curve of the (002) face of an GaN epitaxial layer without metal-doped in one embodiment, and the full width at half maximum (FWHM) of the XRD omega rocking curve is 694 arcsec. FIG. 6B is a graph showing XRD omega rocking curve of the (002) face of a GaN epitaxial layer with metal doping in one embodiment, and the FWHM of the XRD omega rocking curve is 139 arcsec. Obviously, the GaN epitaxial layer with metal doping has better crystalline quality.

Figure 1E:
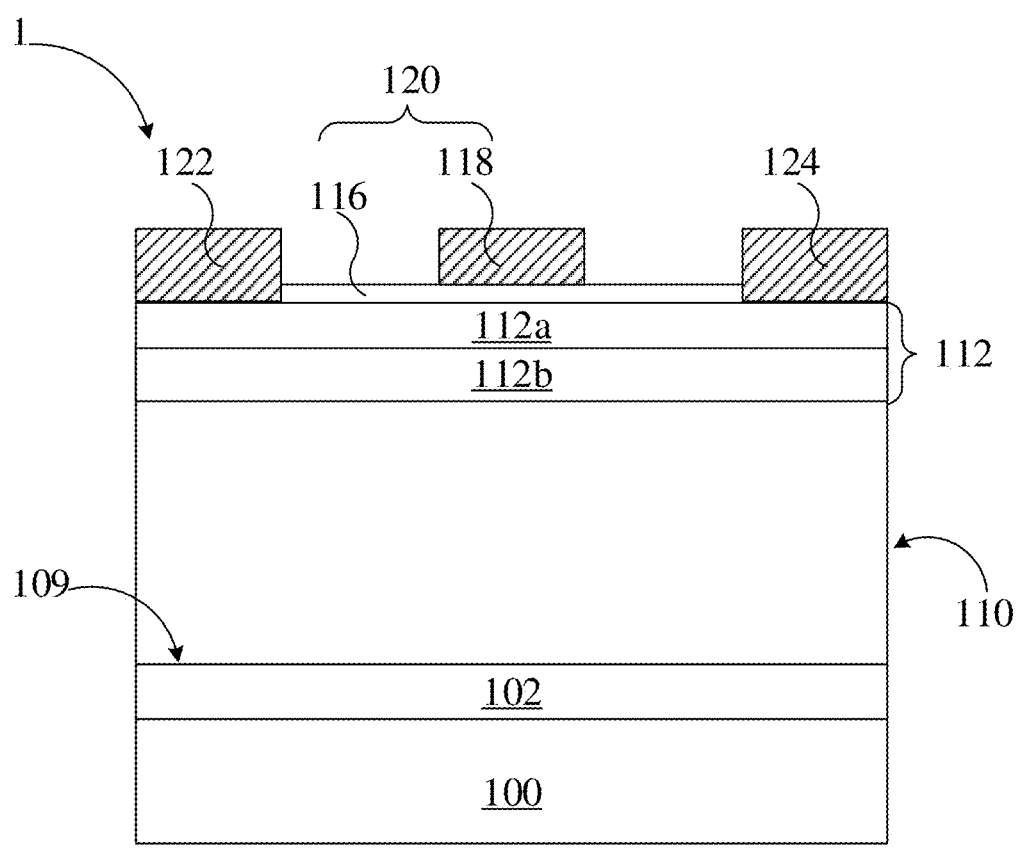

Referring to FIG. 1E and FIG. 2, in some embodiments, the method 200 may also include a step 208: forming a heterojunction 112. The heterojunction 112 may include a GaN/AlGaN heterojunction. As shown in FIG. 1E, the heterojunction 112 may include a channel layer 112b and a barrier layer 112a. In some embodiments, the heterojunction 112 is formed by MOCVD, HYPE, LPE, MBE, MOVPE, PECVD, or another suitable deposition.

Referring to FIG. 1E and FIG. 2, in some embodiments, the method 200 may also include a step 210: forming a gate structure 120, a source contact 122, and a drain contact 124 on the heterojunction 112 to form a semiconductor device 200 such as a transistor (e.g., HEMT, HFET, or MOSFET). In some embodiments, the gate structure 120 includes a gate dielectric layer 116 and a gate contact 118 on the gate dielectric layer 116. Moreover, the source contact 122 and the drain contact 124 are arranged on both sides of the gate structure 120. The gate contact 118, the source contact 122, and the drain contact 124 may be formed of a conductive material, such as metal (e.g., Al, TiN, Au, Ni, Ti, tantalum (Ta), tungsten (W), or a combination thereof) or another suitable electrode material. In some embodiments, the gate dielectric layer 116 may be formed of SiN, SiCN, SiO₂, SiAlN, Al₂O₃, AlON, SiON, HfO₂, HfAlO, or a combination thereof. After formation of the gate structure 120, the source contact 122, and the drain contact 124, a fabrication of the semiconductor device (e.g., a transistor) 1 is completed.

Referring to FIG. 2, in some embodiments, the step 202 may be eliminated. In some embodiments, the sequence of the step 202 and the step 204 may be adjusted, that is, the discontinuous metal atomic layer 104 may be formed on the substrate 100, and then the nucleation layer 102 may be formed on the discontinuous metal layer 104, and then the epitaxial layer 110 may be formed on the nucleation layer 102.

Figure 3:
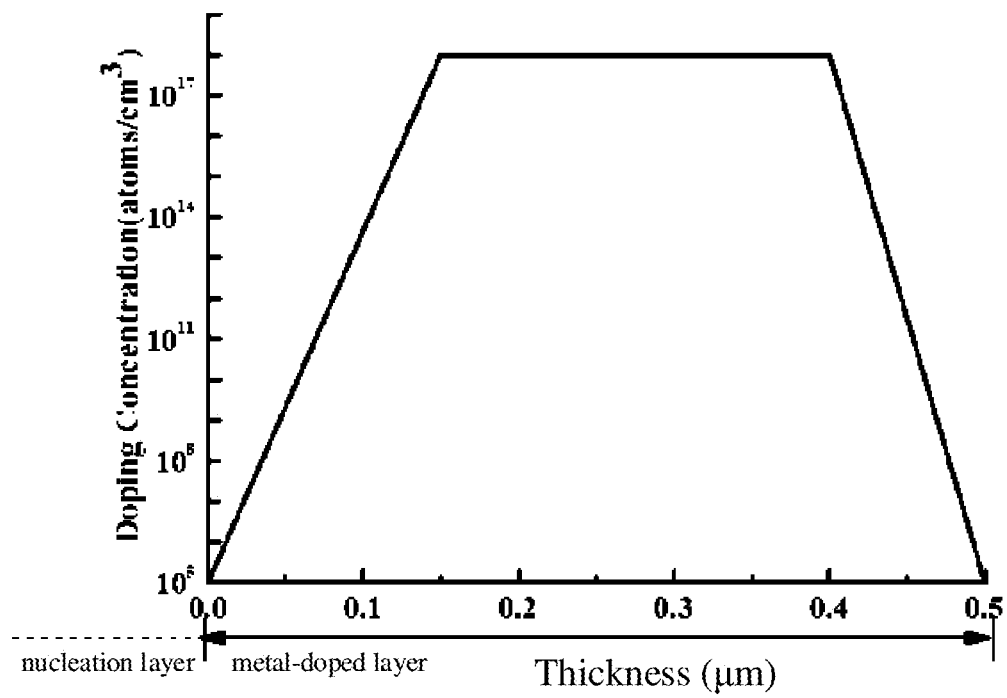
FIG. 3 illustrates a relationship between the doping concentration of the metal atoms and the total thickness of a traditional metal-doped layer.

Referring to FIG. 3, FIG. 3 illustrates a relationship between the doping concentration of the metal atoms and the total thickness of a traditional metal-doped layer. The metal of the traditional metal-doped layer is achieved by directing a flow of metal atoms source to a growth chamber during growing a semiconductor layer. Because of memory effect, the metal may not be doped into the semiconductor layer promptly, so that the doping concentration of the traditional metal-doped layer is increased gradually from the bottom surface (near the nucleation layer) as shown in FIG. 3. Because some atoms in the substrate may diffuse into above layers forming on the substrate, for example, Si atoms in Si, SiC or SiO2 substrate and O atoms in SiO2, MgO or $Al_2O_3$ may diffuse into the semiconductor layer above the substrate, a phenomenon of current leakage is aroused in the semiconductor layer.

Figure 4:
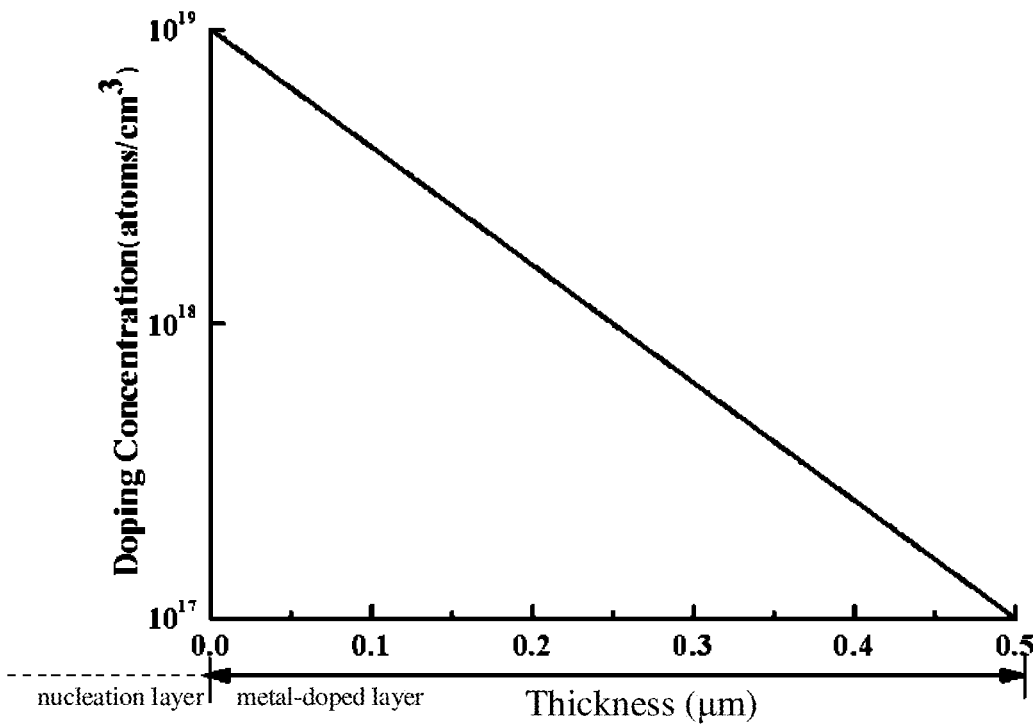
FIG. 4 illustrates a relationship between the doping concentration of the metal atoms and the total thickness of the metal-doped layer as the embodiment shown in FIG. 1D.

Referring to FIG. 4, FIG. 4 illustrates an embodiment of a relationship between the doping concentration of the metal atoms and the thickness of the metal-doped layer 110a shown in FIG. 1D. The metal-doped layer 110a according to above-mentioned method in this disclosure has the doping concentration decreased form the bottom surface (near the nucleation layer) to the top surface. The metal-doped layer 110a has a maximum doping concentration (e.g., $1\times10^{19}$ atoms/cm$^3$) of metal atoms at a bottom surface near the substrate, and the metal can increase the resistance, so a phenomenon of current leakage corresponding to diffusion of atoms from the substrate is eliminated.

In some embodiments, the doping concentration of metal atoms at the bottom surface of the metal-doped layer 110a is larger than $1\times10^{17}$ atoms/cm$^3$, such as $2\times10^{17}$ atoms/cm$^3$, $1\times10^{18}$ atoms/cm$^3$.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a semiconductor structure, comprising:
   providing a substrate;
   forming a discontinuous metal atomic layer on the substrate; and
   forming an epitaxial layer on the discontinuous metal atomic layer and parts of the substrate uncovered by the discontinuous metal atomic layer, wherein metal atoms of the discontinuous metal atomic layer are driven into the epitaxial layer during the growth of the epitaxial layer, so that at least a part of the epitaxial layer is doped with metal atoms, a doping concentration of the metal atoms is decreased from a bottom surface to a top surface of the epitaxial layer, the bottom surface of the epitaxial layer being a surface near the substrate.

2. The method as claimed in claim 1, further comprising forming a nucleation layer between the substrate and the discontinuous metal atomic layer.

3. The method as claimed in claim 2, wherein the nucleation layer comprises GaN, AlN, AlGaN, AlInGaN, or a combination thereof.

4. The method as claimed in claim 1, wherein the epitaxial layer comprises GaN, AlN, AlGaN, AlInGaN, or a combination thereof.

5. The method as claimed in claim 1, wherein the metal of discontinuous metal atomic layer comprises Fe, Mn, Sb, Bi, Cd, Zn, Mg, Na, or a combination thereof.

6. The method as claimed in claim 1, further comprising forming a heterojunction on the epitaxial layer; and
   forming a gate structure, a source contact, and a drain contact on the heterojunction.

7. The method as claimed in claim 6, wherein the gate structure comprises a gate dielectric layer and a gate contact on the gate dielectric layer, the source contact and the drain contact are arranged on both sides of the gate structure.

8. The method as claimed in claim 7, wherein the gate contact, the source contact, and the drain contact are formed of Al, TiN, Au, Ni, Ti, Ta, W, or a combination thereof.

9. The method as claimed in claim 7, wherein the gate dielectric layer is formed of SiN, SiCN, SiO2, SiAlN, Al2O3, AlON, SiON, HfO2, HfAlO, or a combination thereof.

10. A semiconductor structure, comprising:
    a substrate; and
    a discontinuous metal atomic layer on the substrate;
    an epitaxial layer disposed on the discontinuous metal atomic layer, wherein the epitaxial layer is doped with metal atoms, a doping concentration of the metal atoms is decreased from a bottom surface to a top surface of the epitaxial layer, the bottom surface of the epitaxial layer being a surface near the substrate.

11. The semiconductor structure as claimed in claim 10, wherein the doping concentration of the metal atoms at the bottom surface of the metal-doped layer is larger than $1\times10^{17}$ atoms/cm$^3$.

12. The semiconductor structure as claimed in claim 10, further comprising a nucleation layer between the substrate and the metal-doped layer.

13. The semiconductor structure as claimed in claim 10, wherein the nucleation layer comprises GaN, AlN, AlGaN, AlInGaN, or a combination thereof.

14. The semiconductor structure as claimed in claim 10, wherein the epitaxial layer comprises AlN, AlGaN, AlInN, AlInGaN, or a combination thereof.

15. The semiconductor structure as claimed in claim 10, wherein the metal atoms comprise Fe, Mn, Sb, Bi, Cd, Zn, Mg, Na, or a combination thereof.

16. The semiconductor structure as claimed in claim 10, further comprising a heterojunction on the metal-doped layer; and
    a gate structure, a source contact, and a drain contact on the heterojunction.

17. The semiconductor structure as claimed in claim 16, wherein the gate structure comprises a gate dielectric layer and a gate contact on the gate dielectric layer, the source contact and the drain contact are arranged on both sides of the gate structure.

18. The semiconductor structure as claimed in claim 17, wherein the gate contact, the source contact, and the drain contact are formed of Al, TiN, Au, Ni, Ti, Ta, W, or a combination thereof.

19. The semiconductor structure as claimed in claim 17, wherein the gate dielectric layer is formed of SiN, SiCN, SiO2, SiAlN, Al2O3, AlON, SiON, HfO2, HfAlO, or a combination thereof.

20. The semiconductor structure as claimed in claim 16, wherein the heterojunction comprises a channel layer and a barrier layer.

* * * * *